United States Patent
Tsubota

(10) Patent No.: US 7,449,854 B2
(45) Date of Patent: Nov. 11, 2008

(54) PWM SIGNAL GENERATION APPARATUS AND METHOD THEREOF AND MOTOR CONTROL APPARATUS AND METHOD THEREOF

(75) Inventor: Masashi Tsubota, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/526,812

(22) Filed: Sep. 26, 2006

(65) Prior Publication Data

US 2007/0145940 A1 Jun. 28, 2007

(30) Foreign Application Priority Data

Sep. 30, 2005 (JP) ............................. 2005-289057

(51) Int. Cl.
*H02M 7/48* (2007.01)
*H02P 27/08* (2006.01)
(52) U.S. Cl. ..................... 318/400.13; 318/400.06; 318/811
(58) Field of Classification Search .............. 388/811; 318/700, 400.01, 400.04, 400.05, 400.06, 318/400.13, 720–724, 799–802, 807, 811
See application file for complete search history.

(56) References Cited

U.S. PATENT DOCUMENTS

| 4,833,375 | A | * | 5/1989 | Del Signore, II | 318/269 |
| 5,309,079 | A | * | 5/1994 | Takada | 318/811 |
| 5,357,219 | A | * | 10/1994 | Fujii | 332/109 |
| 5,486,747 | A | * | 1/1996 | Welch | 318/811 |
| 5,793,234 | A | * | 8/1998 | Cho | 327/175 |
| 6,310,912 | B1 | * | 10/2001 | Maiocchi et al. | 375/238 |
| 7,017,069 | B2 | * | 3/2006 | Kudo et al. | 713/500 |
| 2002/0184469 | A1 | * | 12/2002 | Bowling | 712/1 |
| 2005/0285582 | A1 | * | 12/2005 | Azuma et al. | 323/282 |

FOREIGN PATENT DOCUMENTS

JP 2004-301806 10/2004

* cited by examiner

*Primary Examiner*—Bentsu Ro
(74) *Attorney, Agent, or Firm*—McGinn IP Law Group, PLLC

(57) ABSTRACT

A PWM signal generation of the present invention includes a counter, a compare register, a comparator comparing a compare value of the compare register with a count value of the counter and outputting an identity signal, a PWM signal generation circuit determining a pulse width of a PWM signal according to the identity signal, and an additional bit setting register storing an additional bit provided to change the pulse width of the PWM signal.

18 Claims, 4 Drawing Sheets

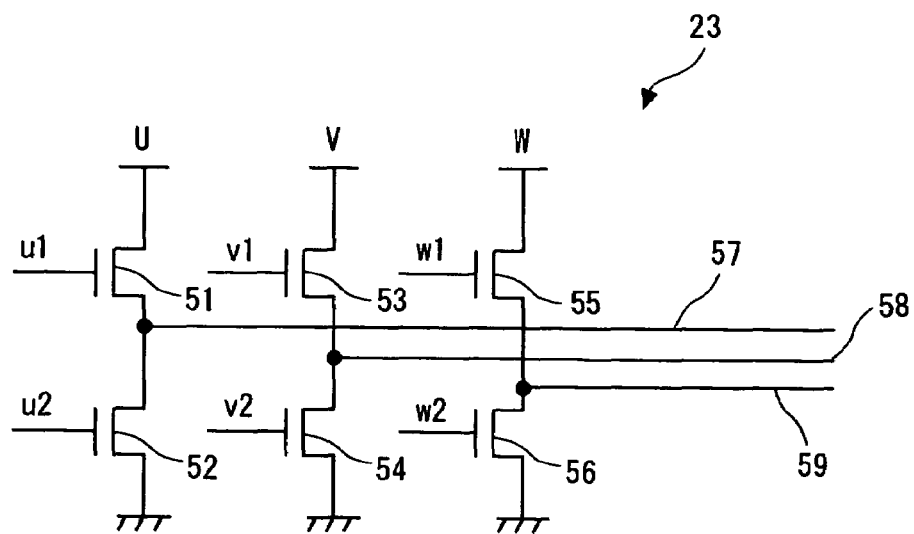
Fig. 2
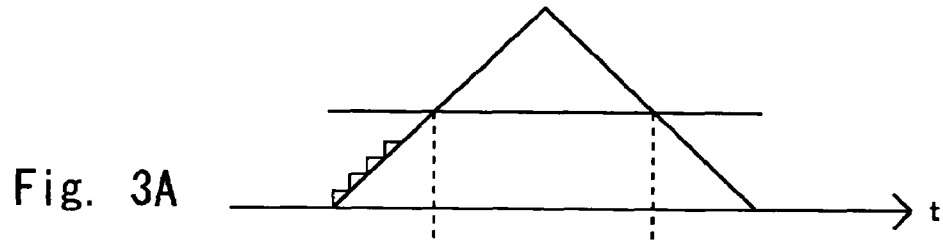
Fig. 3A
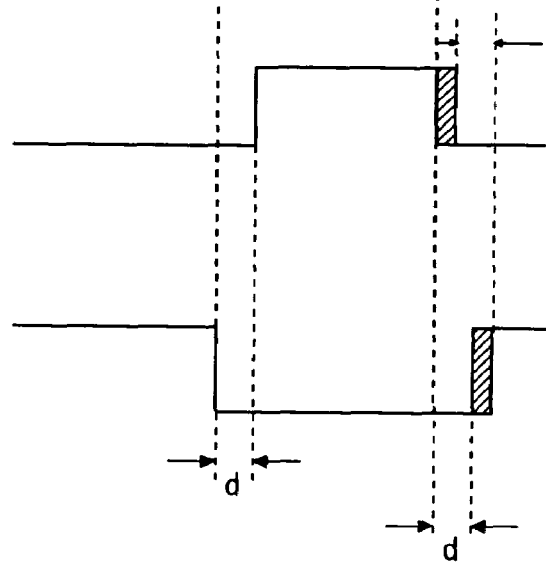
Fig. 3B
Fig. 3C

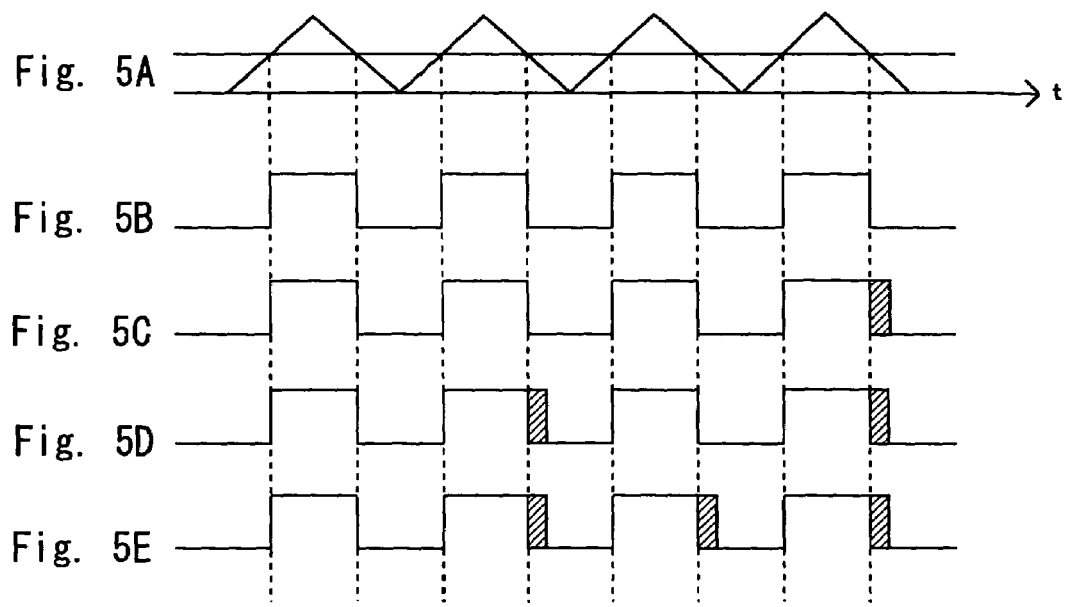
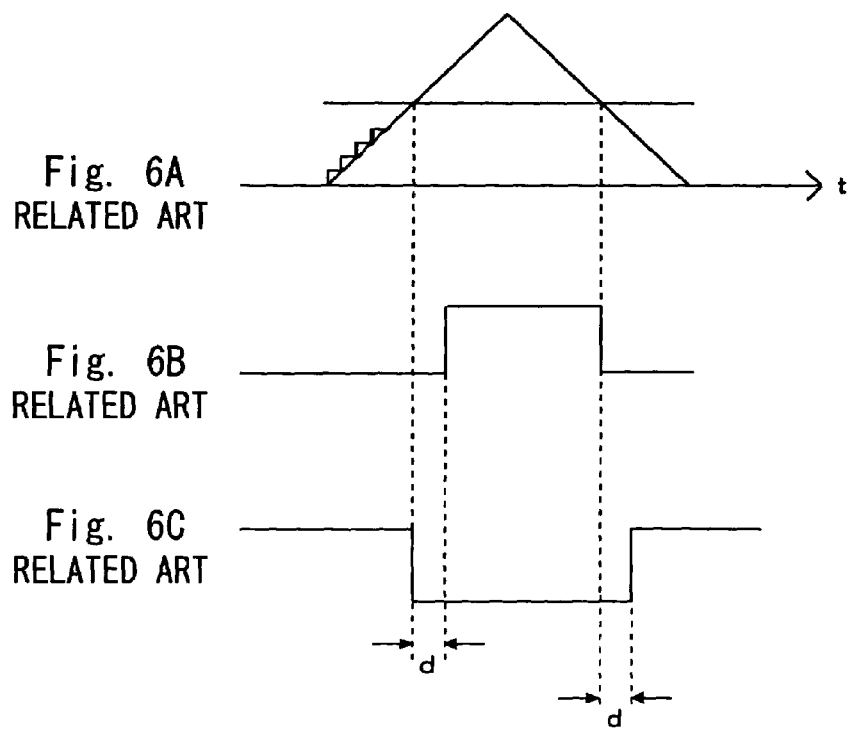

US 7,449,854 B2

PWM SIGNAL GENERATION APPARATUS AND METHOD THEREOF AND MOTOR CONTROL APPARATUS AND METHOD THEREOF

BACKGROUND OF THE INVENTION

1. Field of the Invention

The present invention relates to a PWM signal generation apparatus and a method thereof for generating a PWM signal and a motor control apparatus and a method thereof for controlling a motor using a PWM signal. More particularly, the present invention relates to a PWM signal generation apparatus and a method thereof for generating a PWM signal using a counter and a motor control apparatus and a method thereof using a PWM signal.

2. Description of Related Art

Generally PWM (Pulse Width Modulation) control method is used to control a motor. In the PWM control method, with a constant switching cycle (PWM output cycle), a voltage applied to a motor is controlled by changing on time of a switching circuit. That is, in the PWM control method, a rotation speed of a motor is controlled by changing a duty ratio of a pulse signal.

A digital three-phase waveform generation apparatus for performing this PWM control is disclosed in Japanese Unexamined Patent Application Publication No. 2004-301806. This apparatus includes an up/down counter that changes in a triangular waveform and a register. A pulse width is determined by comparing a counter value of the up/down counter and a register value of the register. In other words, a pulse width is determined by a timing that the register value equals to the counter value while counting up and a timing that the register value equals the counter value while counting down. A pulse width modulation is performed by changing the register value. In this apparatus, the three-phase motor can be controlled by an operation to rewrite three registers. Accordingly the number of devices can be kept to a minimum, reducing processing capacity of a Micro Controller Unit.

In a conventional PWM waveform generation apparatus, a pulse width is determined by comparing a up/down counter value that changes in a triangular waveform and the register value (see in FIG. 6A). That is, a pulse width is time between a timing that the counter value equals to the register value while counting up and a timing that the counter value equals to the register value while counting down.

Suppose that the count number of the up/down counter is M. The up/down counter repeatedly counts up and down from 0 to M and from M to 0. Suppose that a register for generating a PWM output waveform is N (where M>N). In case a cycle of a clock of a counter is 1, a pulse width of a PWM output signal is 2×(M−N). It means that a count value from the register value to the count number is (M−N) while counting up. On the other hand the count number from the count number M to the register value N is also (M−N) while counting down. Accordingly a pulse width of the PWM output signal is a sum of the count numbers, which is 2×(M−N).

The pulse width of PWM output signal is determined in accordance with an identity signal based on a comparison between the register value and the counter value. For example in case a pulse width is 100 when a compare value stored to a compare register is 50, if the compare value changes to 49, the pulse width becomes 102. In case the compare value becomes 51, the pulse width becomes 98. Accordingly 1 rise/fall of the compare value causes the pulse width to rise/fall by 2. In this example, dead time is not considered for the ease of explanation.

As described in the foregoing, the pulse width of the PWM output signal is twofold (m−n). Therefore in a conventional PWM control method, a pulse width can be changed only up to twofold time of a clock cycle of an up/down counter. It has now been discovered that in a conventional PWM waveform generation apparatus, the resolving power of the PWM output signal is only ½ of that of the compare value and ½ of that of the counter. In the conventional PWM waveform generation apparatus, a pulse width cannot be finely configured, thereby making it difficult to improve an accuracy of a motor control.

SUMMARY OF THE INVENTION

According to an aspect of the present invention, there is provided a PWM (Pulse Width Modulation) signal generation apparatus that includes an up/down counter, a rewritable compare register storing a compare value, a comparator comparing the compare value of the compare register with a count value of the up/down counter and outputting an identity signal, a PWM signal generation unit specifying a pulse width of a PWM signal according to a first identity signal from the comparator in a count up operation of the up/down counter and a second identity signal from the comparator in a count down operation of the up/down counter, and an additional bit setting register storing an additional bit provided to change the pulse width of the PWM signal. The PWM signal generation unit changes the pulse width of the PWM signal according to the additional bit. This enables to finely control a pulse width of a PWM signal, thereby increasing a resolving power of the PWM signal.

According to another aspect of the present invention, there is provided A PWM signal generation method that includes storing a compare value to be compared with a count value of an up/down counter according to a setting value from outside and an additional bit for changing a pulse width of a PWM signal, repeatedly performing a count up operation to a specified count number and a count down operation from the specified count number by an up/down counter, comparing the compare value with a counter value in the count up operation and a counter value in the count down operation, outputting an identity signal according to a result of the comparison between the counter and the compare values, specifying a pulse width of a PWM signal according to the identity signal in the count up operation and the identity signal in the count down operation, and generating a PWM signal by changing the specified pulse width of the PWM signal according to the additional bit. This enables to finely control the pulse width of the PWM signal, thereby improving the resolving power of the PWM signal.

According to another aspect of the present invention, there is provided a motor control apparatus for generating a PWM signal to drive a motor according to a status of the motor and controlling the motor according to the PWM signal that includes a feedback control unit calculating a setting value for setting a pulse width of the PWM signal according to an output corresponding to the status of the motor, an up/down counter, a compare register storing a compare value according to the setting value calculated by the feedback control unit, a comparator comparing the compare value of the compare register with a count value of the up/down counter and outputting an identity signal, a PWM signal generation unit generating the PWM signal having a pulse width determined according to the identity signal in a count up operation of the up/down counter and the identity signal in a count down operation of the up/down counter, and an additional bit generation unit generating an additional bit according to a bit lower than the compare value among the setting value calculated in the feedback control unit. The motor control apparatus changes the pulse width of the PWM signal generated by the PWM signal generation unit according to the additional bit generated in the additional bit generation unit. This enables to finely control the pulse width of the PWM signal, thereby improving the resolving power of the PWM signal. The present invention therefore provides a motor control apparatus for accurately controlling a motor.

According to another aspect of the present invention, there is provided a motor control method for generating a PWM signal to drive a motor depending on a status of the motor and controlling the motor according to the PWM signal that includes calculating a setting value to set a pulse width of the PWM signal according to the status of the motor, storing a compare value to be compared with a count value of an up/down counter according to a setting value from outside and an additional bit for changing a pulse width of a PWM signal, repeatedly performing a count up operation to a specified count number and a count down operation from the specified count number by an up/down counter, comparing the compare value with a counter value in the count up operation and a counter value in the count down operation, outputting an identity signal according to a result of the comparison between the counter and the compare values, specifying a pulse width of a PWM signal according to the identity signal in the count up operation and the identity signal in the count down operation, and generating a PWM signal by changing the specified pulse width of the PWM signal according to the additional bit. This enables to finely control the pulse width of the PWM signal, thereby improving the resolving power of the PWM signal. The present invention therefore provides a motor control apparatus for controlling a motor accurately.

According to another aspect of the present invention, there is provided a PWM signal generation apparatus that includes a counter, a rewritable compare register storing a compare value, a comparator comparing the compare value of the compare register with a count value of the counter and outputting an identity signal, a PWM signal generation unit specifying a pulse width of a PWM signal according to the identity signal; and a means for changing the specified pulse width. This enables to finely control the pulse width of the PWM signal, thereby improving the resolving power of the PWM signal.

According to the present invention, by changing a pulse width of a PWM signal obtained from a comparison between a counter and a comparator, it is possible to provide a PWM signal generation apparatus and a method thereof for generating a PWM signal with high resolving power, and a motor control apparatus and a method thereof for controlling a motor with high accuracy.

BRIEF DESCRIPTION OF THE DRAWINGS

The above and other objects, advantages and features of the present invention will be more apparent from the following description taken in conjunction with the accompanying drawings, in which:

FIG. 2 is a view showing an example of a configuration of an inverter circuit used in a motor control apparatus according to the present invention;

FIGS. 3A to 3C are views showing an example of a PWM signal generated in a PWM output unit used in a motor control apparatus according to the present invention;

FIGS. 5A to 5E are views showing waveforms of a PWM signal with an additional bit having multiple bits; and FIGS. 6A to 6C are views showing a PWM signal generated in a PWM output unit according to a conventional technique.

DESCRIPTION OF THE PREFERRED EMBODIMENTS

Figure 1:
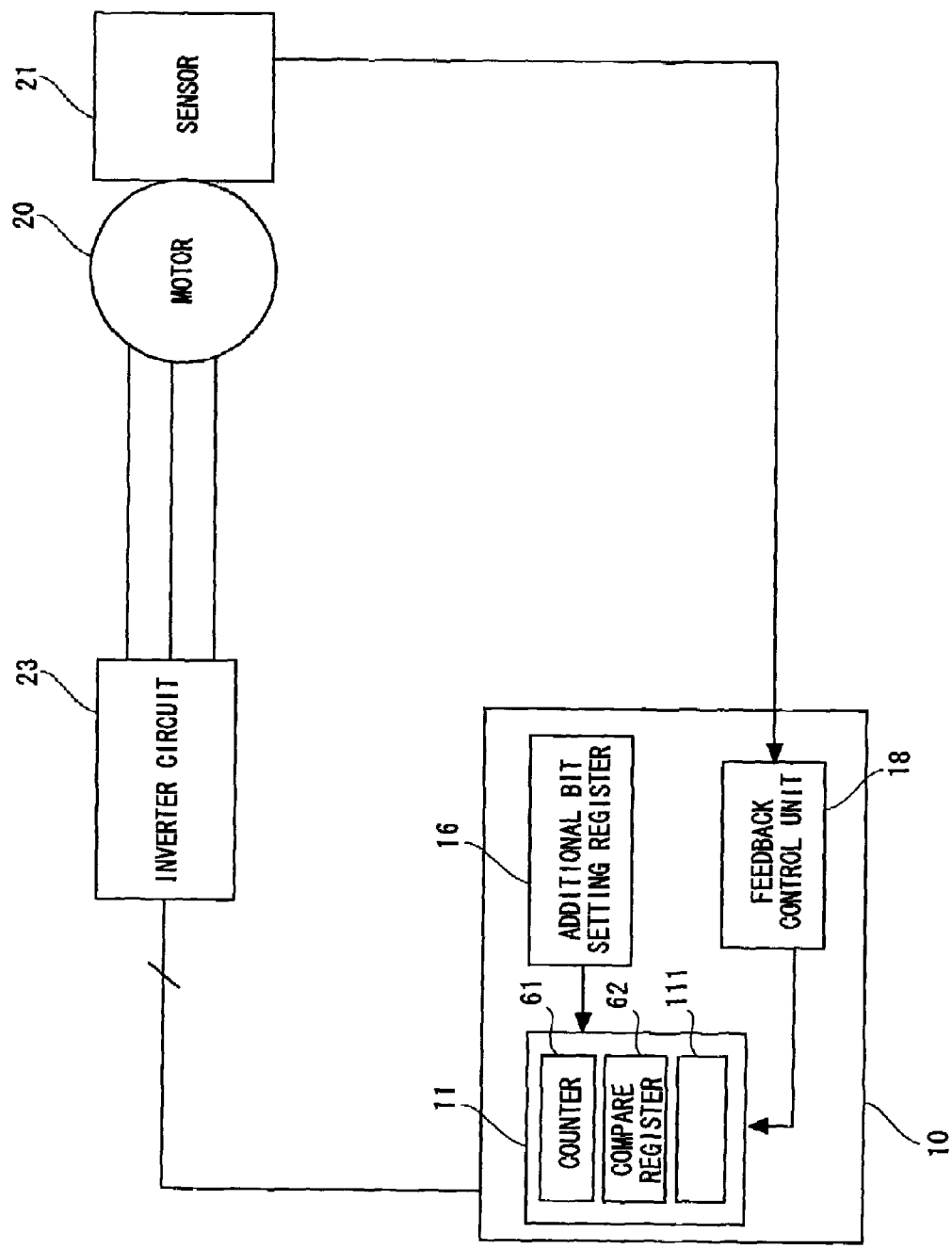
FIG. 1 is a view showing a configuration of a motor control system using a motor control apparatus according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes. Components identical in the drawings are denoted by reference numerals identical to those therein with detailed description omitted.

A control of a three phase brushless motor is explained hereinafter in detail as a preferred embodiment of the present invention. FIG. 1 is a view showing a configuration of a motor control system according to this embodiment. The motor control system includes a MCU (Micro Controller Unit) 10, a PWM output unit 11, an additional bit setting register 16, a feedback control unit 18, a motor 20, a sensor 21, an inverter circuit 23 and so on.

An overall operation of the motor control system is described hereinafter in detail with reference to FIG. 1. The motor control system includes the motor 20, the MCU 10 for controlling the motor 20, the inverter circuit 23 for generating a driving current by a driving signal from the MCU 10, and the sensor 21 for detecting a motor status such as a rotation angle. The MCU 10 generates a driving signal for driving the motor 20 according to a target rotation number input to a target value setting register 111 from outside. The driving signal is generated by the PWM output unit 11. More specifically, the PWM output unit 11 performs a PWM (Pulse Width Modulation) and outputs a PWM signal to be a driving signal for driving the motor 20. The PWM signal is input to the inverter circuit 23. Then the inverter circuit 23 generates a driving current for driving the motor 20 according to the PWM signal from the MCU 10. The motor 20 is for example a three-phase motor. The motor is driven by U, V, and W phase driving currents from the inverter 23. The sensor 21 outputs an output signal corresponding to a rotation angle of the motor 20. A resolver may be used for the sensor 21, for example. An output signal from the sensor 21 is input to the MCU 10. The feedback control unit 18 of the MCU 10 performs a feedback control according to the output signal from the sensor 21 and outputs a control signal to the PWM output unit 11. The PWM output unit 11 sets a compare value to the compare register 62 according to the target rotation number specified to the target setting register 111 and the control signal from the feedback control 18. The compare register 62 is mounted in the PWM output unit 11. The PWM output unit 11 generates a PWM signal from a count value of the counter 61 and the compare value so as to output the PWM signal to the inverter circuit 23. A feedback control is performed by repeating this operation.

In case a control signal is supplied from outside to rotate the motor at a specified rotation number, the PWM output unit 11 mounted in the MCU 10 generates a PWM signal to rotate the motor at the rotation number. A case where the motor 20 is a three-phase DC brushless motor is explained hereinafter. In this case, the PWM signal is comprised of 6 driving signals, u1, u2, v1, v2, w1, and w2 phases. Note that u2, v2, and w2 phases are reversed phases to u1, v1, and w1 phases respectively. Specifically u1, v1, and w1 phases are positive outputs, while u2, v2, and w2 phases are negative outputs. Needless to say that the motor 20 is not restricted to the three-phase DC brushless motor.

The MCU 10 controls the motor 20 by PWM, Pulse Width Modulation. To be specific, The MCU 10 changes on time of a three-phase switching circuit mounted to the inverter circuit 23 to control the motor 20. Further, on time of a switching circuit is changed in a specified switching cycle (PWM pulse cycle) width. That is, a duty ratio of each phase is controlled by changing pulse width in a specified PWM cycle. Duty ratio is specified by a compare value specified to the counter 61 and the compare register 62. A current flowing to the motor can be controlled because a voltage applied to each phase of the motor 20 is changed depending on this duty ratio. Increasing duty ratio to have a longer on time increases rotation speed. Decreasing duty ratio to have a shorter on time decreases rotation speed.

The PWM output unit 11 includes the timer counter 61 and the compare register 62 to perform the above operations. The timer counter 61 is for example an up/down counter for operating in accordance with a clock pulse and forms a triangular wave. Specifically, the timer counter 62 counts up in a clock cycle and counts down when a count value reaches to a specified count number. Then when the counter value becomes 0, the timer counter 61 starts to count up again. The triangular wave is formed by repeating this operation. The compare value specified to the compare register 62 is specified according to a target rotation number set to the target setting register 111 and the control signal from the feedback control unit 18.

As shown in FIG. 1, a driving signal with its pulse width modulated from the PWM output unit 11 of the MCU 10 is input to the inverter circuit 23. The inverter circuit 23 includes switching circuits provided to correspond to each phase as described above. The inverter circuit 23 turns on and off the switching circuits according to the u1, u2, v1, v2, w1, and w2 phase driving signals and outputs U, V, and W phase driving currents to the motor 20. The motor 20 rotates based on the driving currents from the inverter circuit 23.

A configuration of the inverter circuit 23 is explained hereinafter with reference to FIG. 2. FIG. 2 is a circuit view schematically showing a configuration of the inverter circuit 23. The inverter circuit 23 includes transistors (hereinafter referred to as Tr) 51 to 56 as switching circuits. Tr 51 to 56 are power transistors for supplying the driving current to the motor 20. Tr 51 to 56 can be Power MOSFET, for example. U1 phase driving signal is input to a gate terminal of Tr 51. U2 phase driving signal is input to a gate terminal of Tr 52. Tr 51 is turned on and off by the u1 phase driving signal. Tr 52 is turned on and off by the u2 phase driving signal. A source terminal of Tr 51 is supplied with power supply voltage. A drain terminal of Tr 52 is connected to ground. A drain terminal of Tr 51 is connected to a source terminal of Tr 52. Further, the drain terminal of Tr 51 and the source terminal of Tr 52 are connected to an output terminal of a U phase driving current 57. Accordingly in case Tr 51 is on and Tr 52 is off, the U phase driving current 57 flows. On the other hand in case Tr 51 is off and Tr 52 is on, the U phase driving current 57 does not flow. A dead time is included between the u1 phase driving signal and the u2 phase driving signal, so that Tr 51 and Tr 52 are not turned on at the same time. This configuration allows the U phase driving signal 57 to be outputted according to a PWM signal.

V phase driving signal 58 and W phase driving signal 59 are generated in the same way above. Specifically, v1 phase driving signal is input to Tr 53, v2 phase driving signal is input to Tr 54. Tr 53 and Tr 54 are controlled to be on and off as described above to output the V phase driving signal 58. W1 phase driving signal is input to Tr 55, and w2 phase driving signal is input to Tr 56. Then Tr 55 and Tr 56 are controlled to be on and off as described above to output a W phase driving signal 59. The inverter circuit 23 outputs a three-phase driving signal to the motor 20 according to the PWM signal.

Now return to explanation of FIG. 1. The sensor 21 detects a status of the motor 20, for example a rotation angle. Then the sensor 21 outputs a sensor signal based on the rotation angle. The sensor signal is input to the MCU 10. The feedback control unit 18 of the MCU 10 calculates a rotation angle and rotation number of the motor according to the sensor signal from the sensor 21. The feedback control unit 18 outputs a control signal to the PWM output unit 11 based on the calculated value. This is how a feedback control is performed.

To be specific, the feedback control unit 18 controls to increase rotation speed in case the motor rotation angle does not reach a desired angle. In case the motor rotation angle exceeds a desired rotation angle, the feedback control unit 18 controls to slow the rotation speed. The PWM output unit 11 calculates a setting value to set a duty ratio (pulse width) of a PWM signal according to the control signal from the feedback control unit 18 and a desired rotation number specified to the target value setting register 111. The value based on the setting value is a compare value to be stored to the compare register 62 of the PWM output unit 11. Then the PWM output unit 11 generates a PWM signal according to the setting value. For example in case the motor rotation angle does not reach an expected rotation angle, the PWM output unit 11 specifies a compare value so as to increase a duty ratio. In this case, the pulse width of the PWM signal to be on is extended, thereby increasing the motor rotation speed. Accordingly the rotation angle of the motor 20 can reach to the expected rotation angle. Conversely in case the motor rotation angle exceeds the expected rotation angle, the PWM output unit 11 specifies the compare value to decrease a duty ratio. This will shorten the pulse width, thereby slowing the rotation of the motor 20. This enables the rotation angle to reach the expected rotation angle.

In this embodiment, the MCU 10 includes the additional bit setting register 16. While an additional bit is set to the additional bit setting register 16, the PWM output unit 11 controls to increase or decrease a pulse width of a PWM signal depending on the additional bit. To be specific, the PWM output unit 11 generates an additional bit based on a bit lower than the compare value stored to the compare register among the setting value. For example in case a 16 bits setting value is calculated in the feedback control unit 18, upper 15 bits of the setting value can be the compare value and a least significant bit can be the additional bit. In this case, in case the additional bit set to the additional bit setting register 16 is 1, the pulse width of the PWM signal is controlled to extend for the time corresponding to one cycle of a clock in addition to the pulse width specified by the compare value. In other words, in case the additional bit is 1, a pulse corresponding to 1 cycle of a clock is added to the pulse of the PWM signal. On the other hand, in case the additional bit set to the additional bit setting register 16 is 0, the pulse width of the PWM signal remains to be the one specified by the compare value. Extending the pulse width of the PWM signal for the time corresponding to 1 cycle of a clock depending on the additional bit enables to improve a resolving power of the PWM signal. The pulse width of the PWM signal, which is a duty ratio, is determined by the compare value specified to the compare register 62 and the additional bit specified to the additional bit setting register 16. The additional bit is stored to the register. The additional bit setting register for storing the additional bit setting register can be a part of the compare register. Otherwise, the additional bit setting register can be a separate register from the compare register.

The PWM signal with longer pulse width by the additional bit is shown in FIGS. 3A to 3C. FIG. 3A is a view showing a count value of the up/down counter. FIG. 3B is a view showing the u1 phase PWM signal. FIG. 3C is a view showing the u2 phase PWM signal. As shown in FIG. 3A, the up/down counter repeatedly counts up and down from/to a specified count number. This will form a triangular wave shown in FIG. 3A. The horizontal line in FIG. 3A indicates the compare value stored to the compare register. The pulse width of the PWM signal is determined according to the compare value. In other words, the pulse width is determined by timings the counter value of the up/down counter and the compare value are equal, during comparing these values.

As shown in FIGS. 3B and 3C, a dead time d is provided between the u1 and u2 phase PWM signals so that the u1 and u2 phase PWM signals are not turned on at the same time. Specifically, the time Tr 52 is turned off is configured to be longer for the specified dead time than the time Tr 51 is turned on. Accordingly after Tr 52 is turned off, Tr 51 is turned on to pass the driving current. Then after Tr 51 is turned off to stop supplying the driving current, Tr 52 is turned on. Overcurrent is prevented in this way.

In FIGS. 3B and 3C, a PWM signal with its pulse width being extended by an additional bit is illustrated. The pulse width being extended by the additional bit is indicated with shaded portion. In case the additional bit is 1, pulse widths of u1 and u2 phase PWM signal are extended for 1 clock. That is, the u1 phase PWM signal extends a pulse width to be high, and the u2 phase PWM signal extends a pulse width to be low. The time a pulse width is extended corresponds to a pulse width of a clock of the up/down counter. Extending the pulse width of the PWM signal according to the additional bit enables to improve the resolving power of the PWM signal. In this example, pulse widths of both positive and reversed phase PWM signals are extended to secure the dead time.

Suppose that a count number of the up/down counter is M, and a register value for generating a PWM signal is N (wherein M>N). In this example dead time is 0 and a clock cycle of the counter is 1, for the ease of explanation. In case the additional bit is 0, meaning that the pulse width is not extended, the pulse width of the PWM signal is 2×(M−N). On the other hand the additional bit is 1, meaning that the pulse width is extended, the pulse width of the PWM signal is extended for a clock cycle, resulting to be 2×(M−N)+1. For example in case the compare value is 50, the additional bit is 0, and the pulse width becomes 100, if the additional bit becomes 1, the pulse width is extended to 101. Accordingly in a conventional technique, the pulse width changes by 2 for a change in the compare value by 1. However the pulse width can be changed by only 1 in the present invention. Therefore, it is possible to generate a PWM signal having the same resolving power as that of the counter. This enables to adjust the pulse width of the PWM signal by clock cycle, thereby capable of accurate control over the motor 20.

Figure 4:
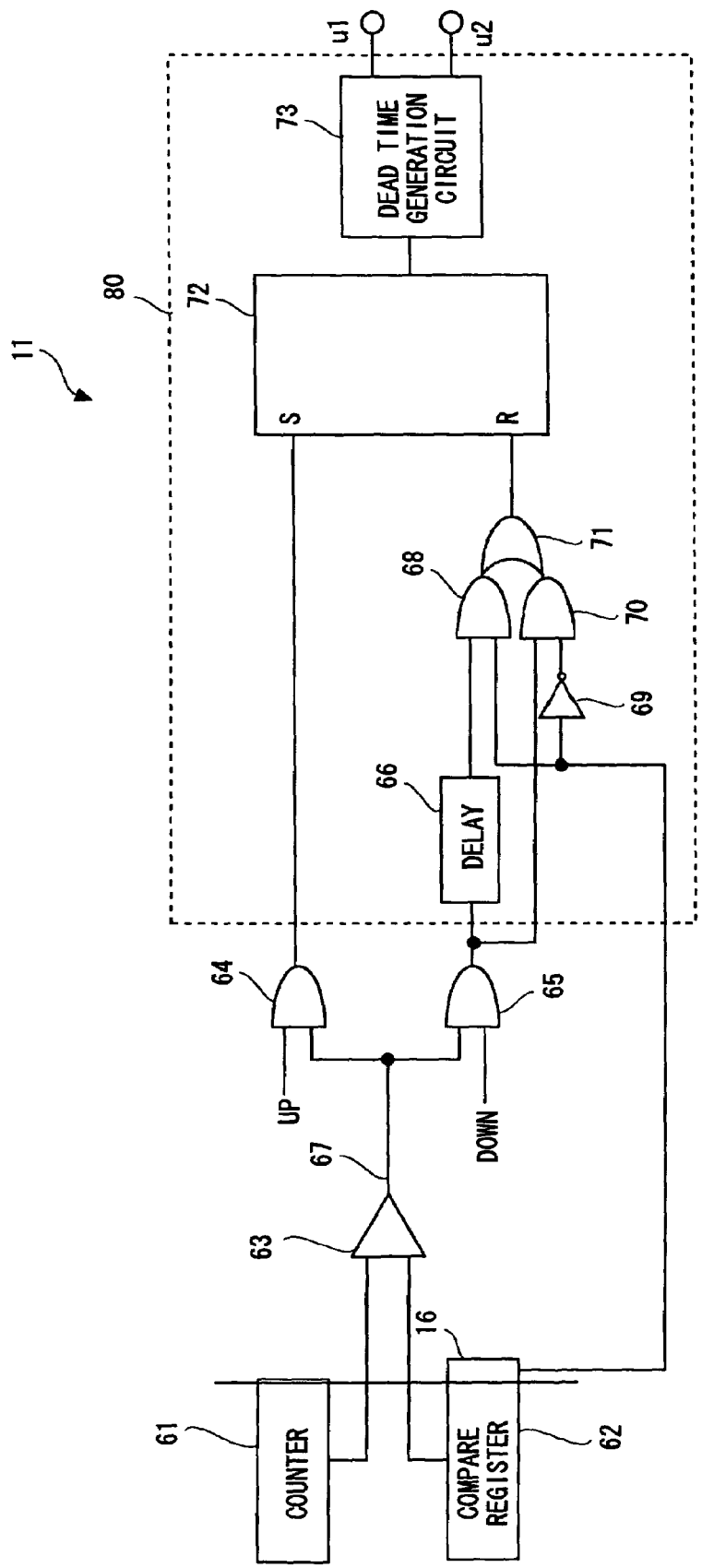
FIG. 4 is a view showing an example of circuit configuration of a PWM output unit used in a motor control apparatus according to the present invention.

A configuration of the PWM output unit 11 for extending the pulse width by the additional bit is explained hereinafter with reference to FIG. 4. FIG. 4 is a view showing an example of a circuit configuration of the PWM output unit 11. The PWM output unit 11 includes the counter 61 and the compare register 62. The PWM output unit 11 further includes the comparator 62 for outputting an identity signal 67 according to outputs from the counter 61 and the compare register 63.

The PWM output unit 11 further includes a PWM signal generation circuit 80 for generating u1 and u2 phase PWM signals according to the identity signal 67 from the comparator 63. The counter 61 is for example a 15 bits up/down counter. The compare register 62 is a 16 bits register that stores the setting value specified by the feedback control unit 18. Upper 15 bits of the compare register 62 is the compare value to be compared with the counter value of the counter 61. A least significant bit of the compare register 62 is the additional bit. That is, the least significant bit of the compare register 62 is the additional bit setting register 16 that stores the additional bit. The additional bit is not used in a comparison by the comparator 63. Specifically, upper bits for the number of bits same as the number of bits for the counter become the compare value to be compared by the comparator 63. Every time setting value is calculated in the feedback control unit 18, the compare value and the additional bit are rewritten. Then the compare value and the additional bit are stored to the register until the next setting value is calculated in the feedback control unit 18.

The comparator 63 compares the counter value of the counter 61 with a compare value having the same number of bits as the counter 61 to output the identity signal 67. The identity signal 67 becomes high when the compare and counter values are equal and becomes low when the values are different. The identity signal 67 that becomes high when the counter and compare values are equal is output from the comparator 63. The identity signal 67 from the comparator 63 is input to AND circuits 64 and 65. A count up signal for indicating a count up operation of the counter 61 is input to the AND circuit 64. A count down signal for indicating a count down operation of the counter 61 is input to the AND circuit 65. The count up signal becomes high when counter 61 is in the count up operation. The count down signal becomes high when the counter 61 is in the count down operation. The count up signal is input to the AND circuit 64. The AND circuit 64 outputs a signal that becomes high when the counter and register values are equal in the count up operation. On the other hand, the count down signal for indicating that the counter 61 is counting is input to the AND circuit 65. The AND circuit 65 outputs a signal when the counter and register values are equal in the count down operation. In other words, the output from the AND circuit 64 is the identity signal 67 in the count up operation, and the output from the AND circuit 65 is the identity signal 67 in the count down operation.

The output from the AND circuit 64 is input to a set input terminal of a RS flip-flop circuit 72. An output signal from the AND circuit 65 is input to a delay 66 and an AND circuit 70. The delay 66 delays the signal input from the AND circuit 65 for a clock cycle of the counter 61 to output the signal to an AND circuit 68. The additional bit stored to the additional bit setting register 16 is input to the AND circuit 68. An additional bit is reversed and input to an AND circuit 70.

A delay of the output signal from the AND circuit 65 is explained hereinafter in detail. A case of the additional bit 0 is explained first. In case the additional bit is 0, low is input to an input terminal connected to the additional bit setting register 16 of the AND circuit 68. Accordingly in case the additional bit is 0, an output from the AND circuit 68 is low regardless of the identity signal 67. On the other hand, an input signal from the additional bit setting register 16 to the AND circuit 70 is input via a reversing circuit 69. Thus high is input to an input terminal connected to the compare register 62 of the AND circuit 70. In case the additional bit 0 and the identity signal 67 in the count down operation is high, an output from the AND circuit 70 is high. Outputs from the AND circuits 68 and 70 are input to an OR circuit 71. Accordingly in case the output from the AND circuit 70 is high, an output from the OR circuit 71 is high. As described in the foregoing, in case the additional bit is 0, outputs from the AND circuit 70 and the OR circuit 71 equal. That is, in case the additional bit is 0 and the identity signal from the AND circuit 65 is high, the output from the OR circuit 71 is high.

A case of the additional bit 1 is explained hereinafter. In case the additional bit is 1, high is input to another input terminal of the AND circuit 68. Accordingly in case the additional bit is 1 and the identity signal 67 from the AND circuit 65 is high, an output from the AND circuit 68 is high. On the other hand an input signal from the additional bit setting register 16 to the AND circuit 70 is input via the reversing circuit 69. Accordingly low is input from the additional bit setting register 16 to another input terminal of the AND circuit 70. An output from the AND circuit 70 is low regardless of the identity signal 67. Therefore, in case an output from the AND circuit 68 is high, an output from an OR circuit is high. As described in the foregoing, in case the additional bit is 1, outputs from the AND circuit 68 and the OR circuit 71 are equal. In other words, in case the additional bit is 1 and the identity signal 67 input to the AND circuit 68 from the AND circuit 65 via the delay is high, the output from the OR circuit 71 is high.

As described in the foregoing, in case the additional bit is 1, the identity signal 67 from the AND circuit 65, which is the identity signal in the count down operation, is delayed by the delay 66. Then the identity signal 67 is input to a reset input terminal of the RS flip-flop circuit 72. On the other hand in case the additional bit is 0, the identity signal 67 from the AND circuit 65, which is the identity signal in the count down operation, is not delayed by the delay 66. Then the identity signal 67 is input to the reset input terminal of the RS flip-flop circuit 72. Whether the identity signal 67 in the count down operation is delayed or not delayed is determined by the additional bit stored to the additional bit setting register 16, and then the identity signal 67 is input to the reset input terminal of the RS flip-flop circuit 72.

A PWM signal is generated according to an output from the RS flip-flop circuit 72. Specifically, the output from the RS flip-flop circuit 72 becomes the u1 phase PWM signal, and a reversed output from the RS flip-flop circuit 72 is the u2 phase PWM signal. The PWM signal generation circuit 80 further includes a dead time generation circuit 73. The dead time generation circuit 73 delays a rising edge of the input signal for 2 clock cycles. This creates a dead time between the u1 and u2 phase PWM signals as shown in FIG. 3. Extending pulse width of both positive and reversed phase signals depending on the additional bit secures the dead time. This prevents a lack of dead time and an overcurrent from being generated.

Although the u1 and u2 phase PWM signals are explained in the foregoing, PWM signals in v and w phase can be generated in the same way. As described in the foregoing, the identity signal 67 is determined to be delayed or not by the delay 66 in the count down operation depending on the value stored to the additional bit setting register 16. Accordingly the pulse width of the PWM signal can be extended for the time corresponding to 1 clock. This improves the resolving power and also enables to accurately control the motor 20. In the above explanation, the identity signal in the count down operation is delayed. However the identity signal in the count up operation may be delayed. In other words, by delaying the identity signal in either the count down or the count up operation, the pulse width can be extended for a clock cycle. Using the additional bit in this way enables to finely control the pulse width of the PWM signal.

In the above explanation, the least significant bit of the compare register 62 is the additional bit setting register 16. However, it is not restricted to this, but the additional bit setting register 16 can be a register different from the compare register 62. To be specific, the compare register 62 is made a register for storing the number of bits same as the number of bits in the counter 61, and the additional bit setting register 16 is made to be 1 bit register. It is possible to improve the resolving power without raising the clock frequency. Therefore, it is possible to improve the resolving power without increasing power consumption.

Further, by configuring the additional bit setting register 16 as a part of the compare register 62, it is possible to write a part of the setting value calculated by the MCU 10 directly to the additional bit setting register 16. It therefore reduces load on the software. Further, by making lower bits that are not compared by the comparator in the compare register 62 to be the additional bit, it is not necessary to form a register for the additional bit. This enables to improve the resolving power with simple configuration.

The additional bit is 1 bit in the explanation above, however the additional bit can be multiple bits. This is explained with reference to FIGS. 5A to 5E. FIGS. 5A to 5E are views showing an example of a waveform of a PWM signal where the additional bit is multiple bits, 2 bits in this case. FIG. 5A is a signal waveform of an up/down counter. FIGS. 5B to 5E are views showing waveforms of a PWM signal of varying additional bit values.

FIG. 5B is a waveform of an additional bit "00", FIG. 5C is a waveform of an additional bit "01", FIG. 5D is a waveform of an additional bit it "10", and FIG. 5E is a waveform of an additional bit "11". In FIG. 5A, triangular waveforms for 4 cycles of the up/down counter is illustrated. The compare values in the triangular waves are constant.

In each of the four triangular waves, the compare and the counter values are compared to generate the PWM signal. Specifically, the pulse width is determined according to the compare and the counter values. The pulse width is changed according to the additional bit value as shown in FIGS. 5B to 5E. For example with the additional bit "11", 3 pulses in the 4 PWM signal pulses have their pulse width extended. Specifically, pulse widths of the second, third, and fourth pulses in the four pulses are extended. Similarly, with the additional bit "10", two pulses in the 4 PWM signal pulses have their pulse width extended. With the additional bit "01", 1 pulse in the 4 PWM signal pulses has its pulse width extended. With the additional bit "00", pulse widths of the 4 PWM signal pulses remain the same. A plurality of pulse length of PWM signals are changed according to the additional bit in this way. This enables to further improve resolving power with a simple configuration. Note that an order of the pulses extended by the additional bit is not restricted to the order shown in FIGS. 5C to 5E.

The additional bit of the pulse width corresponding to the clock cycle is divided into a plurality of pulses of the PWM signal to be added. That is, among a plurality of pulses of the PWM signal, pulse widths of a part of the pulses are extended. For example computation speed of the setting value may be slow and the computation time may exceed the time of two count cycles of the up/down counter. In this case, the compare value and the additional bit cannot be rewritten in each of count cycle. By making the pulses extended by the additional bit to be a part of the plurality of pulses, lower bits than the setting value can be used. This further improves the resolving power. Accordingly in case a rewriting cycle of the compare value and the additional bit is longer than a count cycle of the up/down counter, it is possible to accurately control the motor. The number of the bits of the additional bit may be more than 2. The number of bits of the additional bit may be configured according to the rewriting cycle of the compare value and the additional bit. The additional bit having at least 2 bits may be lower bits of the setting value. That is, the additional bit can be bits after the count value among the setting value. To be specific, suppose the up/down counter may be 14 bits and the setting value is 16 bits, the additional bits may be lower 2 bits, which are 15th and 16th bits. In this case, the compare value is the upper 14 bits.

The embodiment explained that a pulse width is changed while counting down, however the pulse width can be changed while counting up. In this case as with the above case, pulse widths for both positive and reversed phase are changed to keep a dead time. A resolver, a hall sensor, a current sensor or the like can be used for a sensor. Further, a three-phase motor is explained in this example however it is not restricted to this, but may be any as long as it compares a counter and compare values and generates a pulse. Further, a pulse width of a PWM signal is generated by an up/down counter in this example. However the counter can be any counter and may generate a pulse width having a resolving power better than the resolving power of the counter.

It is apparent that the present invention is not limited to the above embodiment and it may be modified and changed without departing from the scope and spirit of the invention.

What is claimed is:

1. A PWM (Pulse Width Modulation) signal generation apparatus comprising:
    an up/down counter;
    a rewritable compare register storing a compare value;
    a comparator comparing the compare value of the compare register with a count value of the up/down counter and outputting an identity signal;
    a PWM signal generation unit specifying a pulse width of a PWM signal according to a first identity signal from the comparator in a count up operation of the up/down counter and a second identity signal from the comparator in a count down operation of the up/down counter; and
    an additional bit setting register storing an additional bit provided to change the pulse width of the PWM signal,
    wherein the PWM signal generation unit changes the pulse width of the PWM signal according to the additional bit.

2. The PWM signal generation apparatus according to claim 1, further comprising a delay circuit delaying either one of the first identity signal from the comparator in the count up operation or the second identity signal from the comparator in the count down operation while an additional bit is stored to the additional bit setting register;
    wherein the PWM signal generation unit changes the pulse width of the PWM signal according to the identity signal delayed by the delay circuit.

3. The PWM signal generation apparatus according to claim 1, wherein the up/down counter operates according to a clock,
    and the delay circuit delays time to correspond either the first or the second identity signal with a cycle of the clock.

4. The PWM signal generation apparatus according to claim 1, wherein the additional bit has at least 2 bits, and the PWM signal generation apparatus changes pulse widths of a plurality of pulses of the PWM signals according to the additional bit having at least 2 bits.

5. The PWM signal generation apparatus according to claim 1, wherein the additional bit is provided to extend the pulse width of the PWM signal.

6. A PWM (Pulse Width Modulation) signal generation method comprising:
    storing a compare value to be compared with a count value of an up/down counter according to a setting value from outside and an additional bit for changing a pulse width of a PWM signal;
    repeatedly performing a count up operation to a specified count number and a count down operation from the specified count number by the up/down counter;
    comparing the compare value with a counter value in the count up operation and a counter value in the count down operation;
    outputting an identity signal according to a result of the comparison between the counter and the compare values;
    specifying the pulse width of the PWM signal according to the identity signal in the count up operation and the identity signal in the count down operation; and
    generating the PWM signal by changing the specified pulse width of the PWM signal according to the additional bit.

7. The PWM signal generation method according to claim 6, wherein the up/down counter operates according to a clock, and
    the PWM signal generation method changes the pulse width for the time corresponding to a cycle of the clock.

8. The PWM signal generation method according to claim 6, wherein the PWM signal generation method changes the specified pulse width of the PWM signal by delaying the identity signal according to the additional bit.

9. The PWM signal generation method according to claim 6, wherein the additional bit has at least 2 bits, and the PWM signal generation apparatus changes pulse widths of a plurality of pulses of the PWM signals according to the additional bit having at least 2 bits.

10. A motor control apparatus for generating a PWM (Pulse Width Modulation) signal to drive a motor according to a status of the motor and controlling the motor according to the PWM signal, the motor control apparatus comprising:
    a feedback control unit calculating a setting value for setting a pulse width of the PWM signal according to an output corresponding to the status of the motor;
    an up/down counter;
    a compare register storing a compare value according to the setting value calculated by the feedback control unit;
    a comparator comparing the compare value of the compare register with a count value of the up/down counter and outputting an identity signal;
    a PWM signal generation unit generating the PWM signal having a pulse width determined according to the identity signal in a count up operation of the up/down counter and the identity signal in a count down operation of the up/down counter; and
    an additional bit generation unit generating an additional bit according to a bit lower than the compare value among the setting value calculated in the feedback control unit,
    wherein the motor control apparatus changes the pulse width of the PWM signal generated by the PWM signal generation unit according to the additional bit generated in the additional bit generation unit.

11. The motor control apparatus according to claim 10, wherein the up/down counter operates according to a clock, and
    the motor control apparatus changes the pulse width for the time corresponding to a cycle of the clock.

12. The motor control apparatus according to claim 10, wherein the motor control apparatus changes the pulse width of the PWM signal by delaying either an identity signal from the comparator in the count up operation or an identity signal from the comparator in the count down operation depending on the additional bit generated in the additional bit generation unit.

13. The motor control apparatus according to claim 10, wherein the additional bit has at least 2 bits, and the motor control apparatus changes pulse widths of a plurality of pulses of the PWM signals according to the additional bit having at least 2 bits.

14. A motor control method for generating a PWM (Pulse Width Modulation) signal to drive a motor depending on a status of the motor and controlling the motor according to the PWM signal, the motor control method comprising:

calculating a setting value to set a pulse width of the PWM signal according to the status of the motor;

storing a compare value to be compared with a count value of an up/down counter according to a setting value from outside and an additional bit for changing the pulse width of the PWM signal;

repeatedly performing a count up operation to a specified count number and a count down operation from the specified count number by the up/down counter;

comparing the compare value with a counter value in the count up operation and a counter value in the count down operation;

outputting an identity signal according to a result of the comparison between the counter and the compare values;

specifying a pulse width of the PWM signal according to the identity signal in the count up operation and the identity signal in the count down operation; and generating the PWM signal by changing the specified pulse width of the PWM signal according to the additional bit.

15. The PWM signal generation method according to claim 14, wherein the
up/down counter operates according to a clock, and
the motor control method changes the pulse width for the time corresponding to a cycle of the clock.

16. The motor control method according to claim 14, wherein the motor control method delays either the identity signal in the count up operation or the identity signal in the count down operation according to the additional bit generated in the additional bit generation unit so as to change the pulse width of the PWM signal.

17. The motor control apparatus according to claim 14, wherein the additional bit has at least 2 bits, and the motor control method changes pulse widths of a plurality of pulses of the PWM signals according to the additional bit having at least 2 bits.

18. A PWM signal generation apparatus comprising:
a counter;
a rewritable compare register storing a compare value, the compare value including a first value and a second value;
a comparator comparing the first value of the compare register with a count value of the counter and outputting an identity signal; and
a PWM signal generation unit specifying a first pulse width of a PWM signal according to the identity signal and a second pulse width according to the second value,
wherein the PWM signal generation unit generates the PWM signal having sum of the first pulse width and the second pulse width.

* * * * *